United States Patent
Gouchi

(10) Patent No.: US 9,585,256 B2
(45) Date of Patent: Feb. 28, 2017

(54) COMPONENT-EMBEDDED SUBSTRATE AND MANUFACTURING METHOD THEREOF

(71) Applicant: Murata Manufacturing Co., Ltd., Kyoto (JP)

(72) Inventor: Naoki Gouchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 253 days.

(21) Appl. No.: 14/565,532

(22) Filed: Dec. 10, 2014

(65) Prior Publication Data
US 2015/0092369 A1    Apr. 2, 2015

Related U.S. Application Data

(63) Continuation of application No. PCT/JP2013/074300, filed on Sep. 10, 2013.

(30) Foreign Application Priority Data

Oct. 3, 2012    (JP) .................................. 2012-221664

(51) Int. Cl.
H05K 1/18    (2006.01)
H05K 3/46    (2006.01)
(Continued)

(52) U.S. Cl.
CPC ............. *H05K 1/185* (2013.01); *B32B 37/04* (2013.01); *B32B 37/142* (2013.01); *B32B 37/18* (2013.01);
(Continued)

(58) Field of Classification Search
CPC ............... H05K 1/185; H05K 2201/10; H05K 2201/1006; H05K 2201/10204
(Continued)

(56) References Cited

U.S. PATENT DOCUMENTS

| | | | |
|---|---|---|---|
| 2009/0025961 A1* | 1/2009 | Kanemaru .......... | H01L 23/5389 174/250 |
| 2010/0295170 A1* | 11/2010 | Komura ............. | H01L 23/3677 257/700 |
| 2013/0176701 A1* | 7/2013 | Toda ..................... | H05K 1/188 361/762 |

FOREIGN PATENT DOCUMENTS

| | | |
|---|---|---|
| JP | 2008-141007 A | 6/2008 |
| JP | 2008-227429 A | 9/2008 |

(Continued)

OTHER PUBLICATIONS

International Search Report issued in Application No. PCT/JP2013/074300 dated Oct. 8, 2013.
(Continued)

*Primary Examiner* — Binh Tran
(74) *Attorney, Agent, or Firm* — Pearne & Gordon LLP

(57) ABSTRACT

A component-embedded substrate includes a multilayer body formed by stacking up a plurality of resin layers in a predetermined direction, a component embedded in the multilayer body, the component having a plurality of terminal electrodes, a plurality of joining conductors provided in the multilayer body and joined to the plurality of terminal electrodes, a plurality of wiring conductors provided in the multilayer body and electrically coupled to the plurality of joining conductors and at least one auxiliary member enclosed within an outer boundary of the component provided in the multilayer body. The auxiliary member may be electrically insulated from each of the plurality of wiring conductors and arranged to balance pressures acting on the plurality of terminal electrodes when pressure is applied on the multilayer body.

20 Claims, 12 Drawing Sheets

(51) Int. Cl.
  *B32B 37/18* (2006.01)
  *H05K 1/02* (2006.01)
  *H05K 1/03* (2006.01)
  *H05K 1/11* (2006.01)
  *H01L 23/00* (2006.01)
  *B32B 37/04* (2006.01)
  *B32B 37/14* (2006.01)
  *H05K 7/10* (2006.01)
  *H05K 7/12* (2006.01)

(52) U.S. Cl.
  CPC .............. *H01L 24/19* (2013.01); *H01L 24/25* (2013.01); *H05K 1/0298* (2013.01); *H05K 1/0313* (2013.01); *H05K 1/115* (2013.01); *H05K 1/181* (2013.01); *H05K 1/186* (2013.01); *H05K 3/4632* (2013.01); *B32B 2305/342* (2013.01); *H01L 2224/04105* (2013.01); *H01L 2224/2518* (2013.01); *H01L 2924/12042* (2013.01); *H05K 2201/0129* (2013.01); *H05K 2201/0141* (2013.01); *H05K 2201/0154* (2013.01); *H05K 2201/09781* (2013.01); *H05K 2201/10* (2013.01); *H05K 2201/1006* (2013.01); *H05K 2201/10204* (2013.01); *H05K 2203/063* (2013.01)

(58) Field of Classification Search
  USPC .................................. 361/761, 763, 764, 770
  See application file for complete search history.

(56) References Cited

FOREIGN PATENT DOCUMENTS

| | | |
|---|---|---|
| JP | 2009-032824 A | 2/2009 |
| JP | 2011-009715 A | 1/2011 |
| JP | 2012-074497 A | 4/2012 |

OTHER PUBLICATIONS

Written Opinion issued in Application No. PCT/JP2013/074300 dated Oct. 8, 2013.

Notification of Reason of Rejection issued in corresponding Japanese Patent Application No. 2014-539650 dated Jun. 2, 2015.

\* cited by examiner

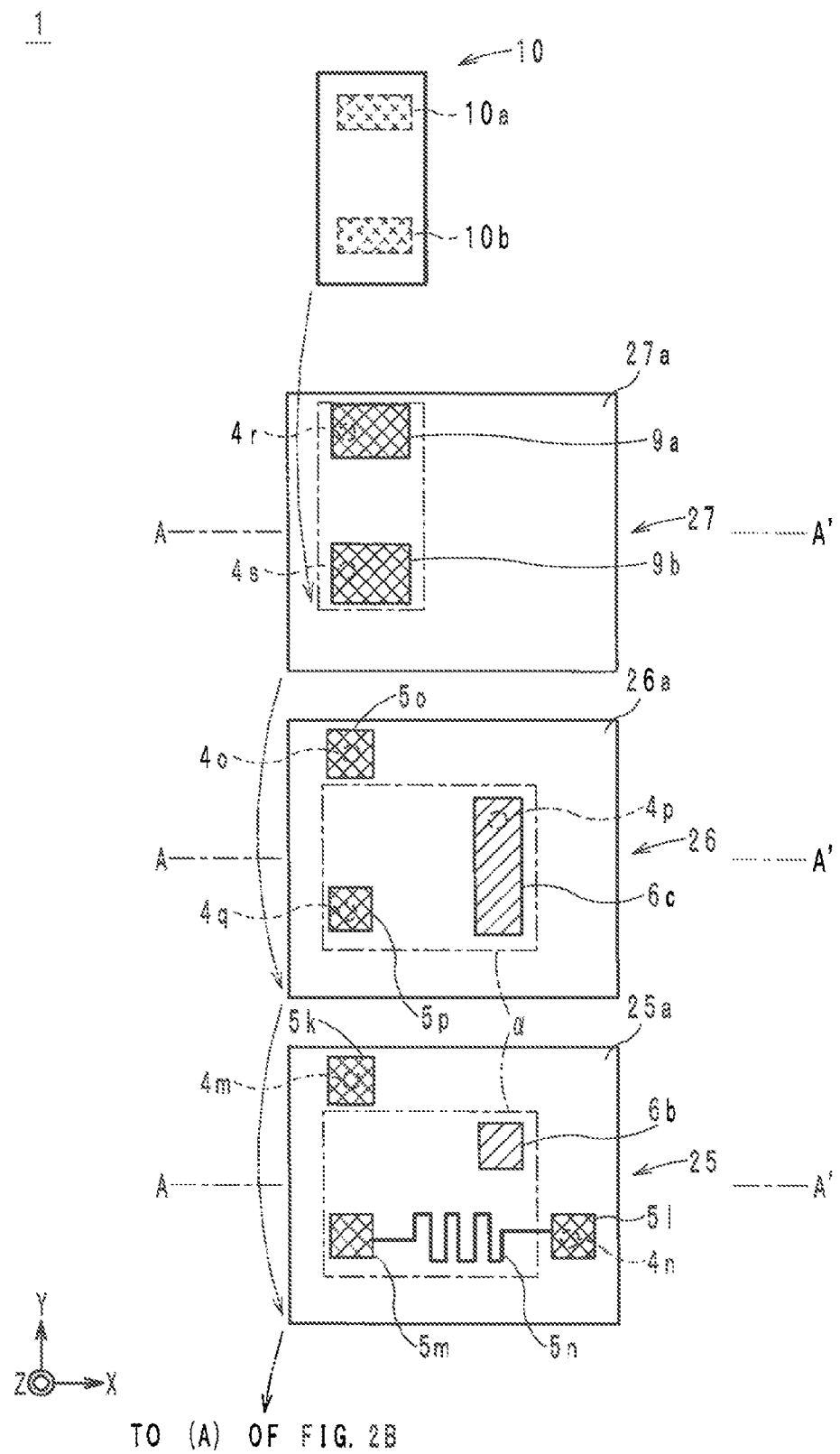

HEATING AND COMPRESSION

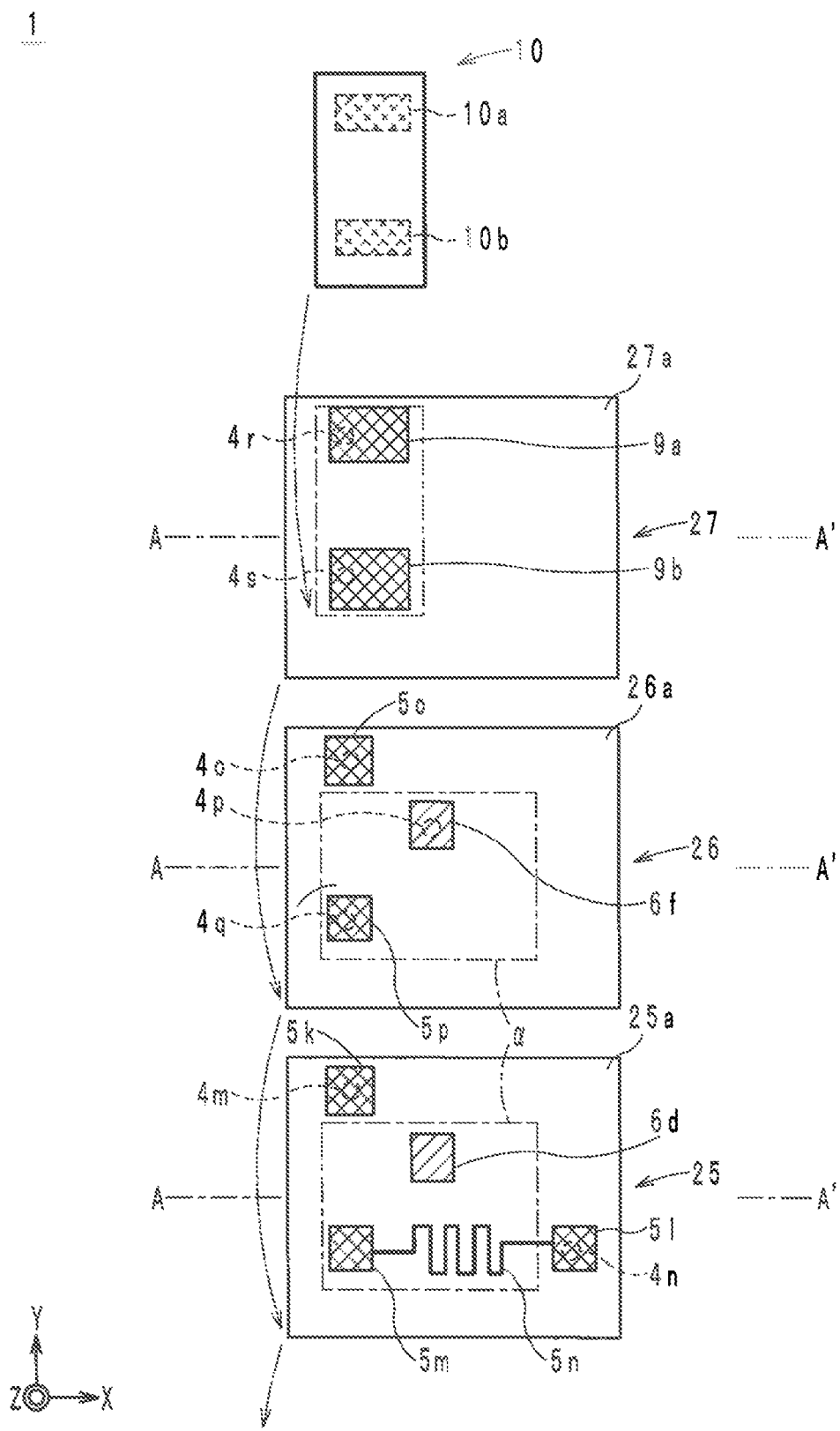

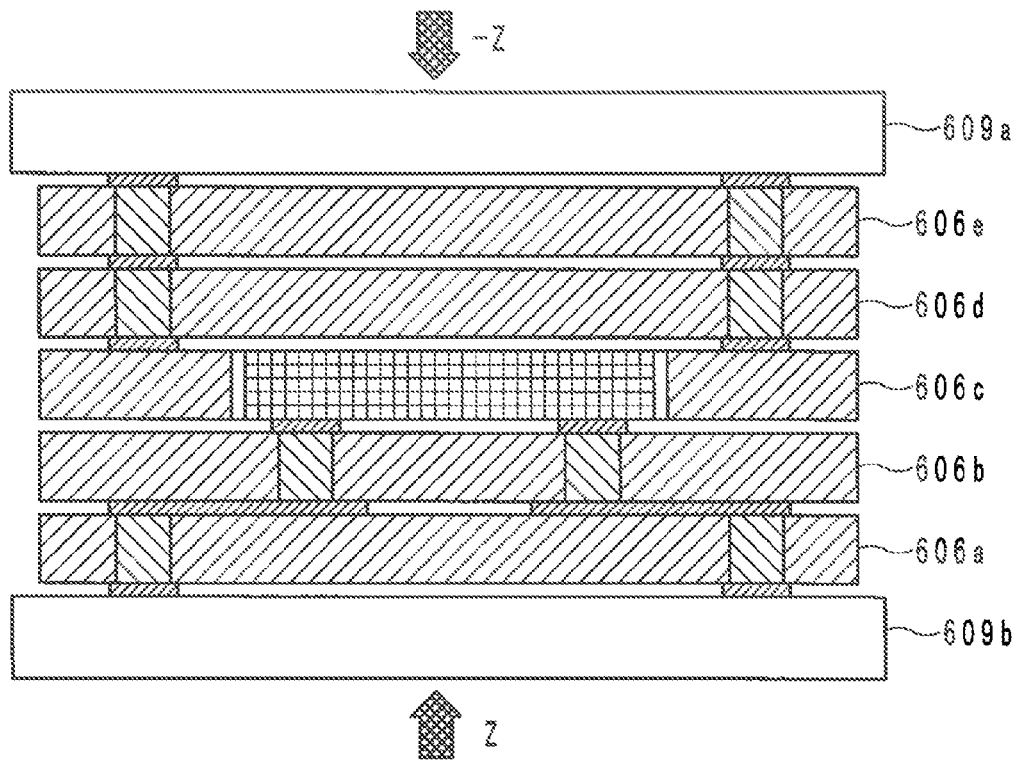

COMPONENT-EMBEDDED SUBSTRATE AND MANUFACTURING METHOD THEREOF

This application is based on Japanese Patent Application No. 2012-221664 filed on Oct. 3, 2012 and PCT/JP2013/074300 filed on Sep. 10, 2013, the contents of which are incorporated herein by reference.

BACKGROUND OF THE INVENTION

1. Field of the Invention

The present invention relates to component-embedded substrates in which an electronic component is embedded in a multilayer substrate and manufacturing methods thereof.

2. Description of Related Art

One of examples of conventional component-embedded substrates is disclosed in, for example, Japanese Patent Laid-Open Publication No. 2008-141007. This component-embedded substrate includes an insulating base 601, at least one electronic component 602, a plurality of external electrodes 603, a plurality of wiring conductors 604, and a plurality of interlayer connectors 605 as shown in FIG. 7.

The insulating base 601 may be formed by stacking up a plurality of resin layers 606 (e.g., five resin layers 606a to 606e) in a predetermined direction Z and then adhering the layers together. The resin layers 606a to 606e may be made of a thermoplastic resin. More specifically, the resin layer 606b may be adhered to one of the principal surfaces of the lowermost resin layer 606a, and the resin layer 606c may be adhered to one of the principal surfaces of the resin layer 606b. Likewise, the resin layers 606d, 606e may be adhered to one of the principal surfaces of the resin layers 606c, 606d, respectively.

The electronic component 602 may be buried in a cavity formed inside the above-described insulating base 601. To electrically couple the electronic component 602 with the external electrodes 603, the wiring conductors 604 may be formed on the principal surface of a required resin layer 606. To electrically couple together two wiring conductors 604 formed on resin layers 606 which are adjacent to each other in the layer stacking direction, an interlayer connector 605 may be formed in a resin layer 606 lying between the wiring conductors 604.

The above-described component-embedded substrate may be manufactured generally through the processes which will be described below.

First, a metal foil (e.g., copper foil) may be adhered to one of the principal surfaces of each of the resin layers 606a to 606e that are made of a thermoplastic resin. Thereafter, photolithography and etching may be carried out on this metal foil, whereby the external electrodes 603 and the wiring conductors 604 may be formed as shown in FIG. 8A.

Then, a through hole 607, which is to form the cavity, may be formed in the resin layer 606c.

Then, via holes 608, which are closed by the wiring conductors 604, may be formed at predetermined positions in the resin layers 606a to 606e. These via holes 608 may be filled with an electrically-conductive paste which is to form the interlayer connectors 605.

After the above-described process, the resin layers 606a to 606e may be stacked up as shown in FIG. 8A. In that process, the electronic component 602 may be placed at a predetermined position on the resin layer 606b and inserted into the through hole 607 of the resin layer 606c. The resin layer 606d may be placed on this resin layer 606c (layer stacking process).

Thereafter, as shown in FIG. 8B, the multilayer body of the resin layers 606a to 606e may be placed between a pair of heat press plates 609a, 609b. The heat press plates 609a, 609b apply pressure and heat to the multilayer body at both surfaces thereof. As a result, the resin layers 606a to 606e may be softened, and adjacent ones of the resin layers 606 may be adhered to each other. In this way, the insulating base 601 may be formed (heating and compression process).

In the heating and compression process, the softened resin layers 606a to 606e may flow, and as a result, the electronic component 602 may be encapsulated in the insulating base 601. At the same time, electrodes 610 of the electronic component 602 may be joined to the wiring conductors 604 or interlayer connectors 605 formed on or in the resin layer 606b. Further, the electrically-conductive paste may be sintered and changed into an alloy, whereby the interlayer connectors 605 electrically coupling the wiring conductors 604 to each other are formed.

SUMMARY OF THE INVENTION

Problems to be Solved by the Invention

As described above, in the heating and compression process, the resin flows due to heating, and pressure is applied to the flowing resin. At this time, even if generally uniform pressure is applied to both surfaces of the multilayer body of the resin layers 606a to 606e, nonuniform pressure is applied to junctions of the electrodes 608 of the electronic component 602 and the interlayer connectors 605 in some cases. As a result, various problems occur, such as tilting of the electronic component 602 to one side relative to the layer stacking direction of the resin layers, and bonding failure between the wiring conductors 604 that are the internal wirings and the interlayer connectors 605.

In view of the above circumstances, an object of the present invention is to provide component-embedded substrates in which problems such as tilting of an embedded electronic component to one side relative to the layer stacking direction of the resin layers and bonding failure are unlikely to occur, and manufacturing methods of such component-embedded substrates.

Solution to Problems

To achieve the above-described object, a component-embedded substrate includes: a multilayer body formed by stacking up a plurality of resin layers in a predetermined direction, the plurality of resin layers being made of a thermoplastic material; a component embedded in the multilayer body, the component having a plurality of terminal electrodes, at least part of the terminal electrodes being provided on an opposite surface with respect to the predetermined direction; a plurality of joining conductors provided in the multilayer body and joined to the plurality of terminal electrodes; a plurality of wiring conductors provided in the multilayer body and electrically coupled to the plurality of joining conductors; and at least one auxiliary member enclosed within an outer boundary of the component when viewed in plan in the predetermined direction and provided in the multilayer body. The auxiliary member may be electrically insulated from each of the plurality of wiring conductors and arranged to balance pressures acting on the plurality of terminal electrodes when pressure is applied on the multilayer body in a manufacture process.

To achieve the above-described object, a component-embedded substrate manufacturing method is a method for manufacturing a component-embedded substrate in which a component is embedded, the component having a plurality of terminal electrodes, at least part of the terminal electrodes being provided on an opposite surface with respect to a predetermined direction, the method comprising: forming, in a plurality of resin layers which may be made of a thermoplastic material, a plurality of joining conductors which may be joined to the plurality of terminal electrodes, a plurality of wiring conductors which may be electrically coupled to the plurality of joining conductors, and at least one auxiliary member within a region where the component may be placed when viewed in plan in the predetermined direction; forming a multilayer body by stacking up the plurality of resin layers in the predetermined direction while embedding the component during the stacking of the layers; and heating and compressing the multilayer body, wherein the auxiliary member may be electrically insulated from each of the plurality of wiring conductors and arranged to balance pressures acting on the plurality of terminal electrodes during the heating and compression of the multilayer body.

BRIEF DESCRIPTION OF THE DRAWINGS

FIG. 2A is a top view of resin layers provided in the upper part of the component-embedded substrate of FIG. 1.

FIG. 6A is a top view of resin layers provided in the upper part of a component-embedded substrate according to a variation.

FIG. 8B is a schematic diagram showing a heating and compression process in manufacture of the conventional component-embedded substrate.

DETAILED DESCRIPTION OF THE PREFERRED EMBODIMENTS

Figure 1:
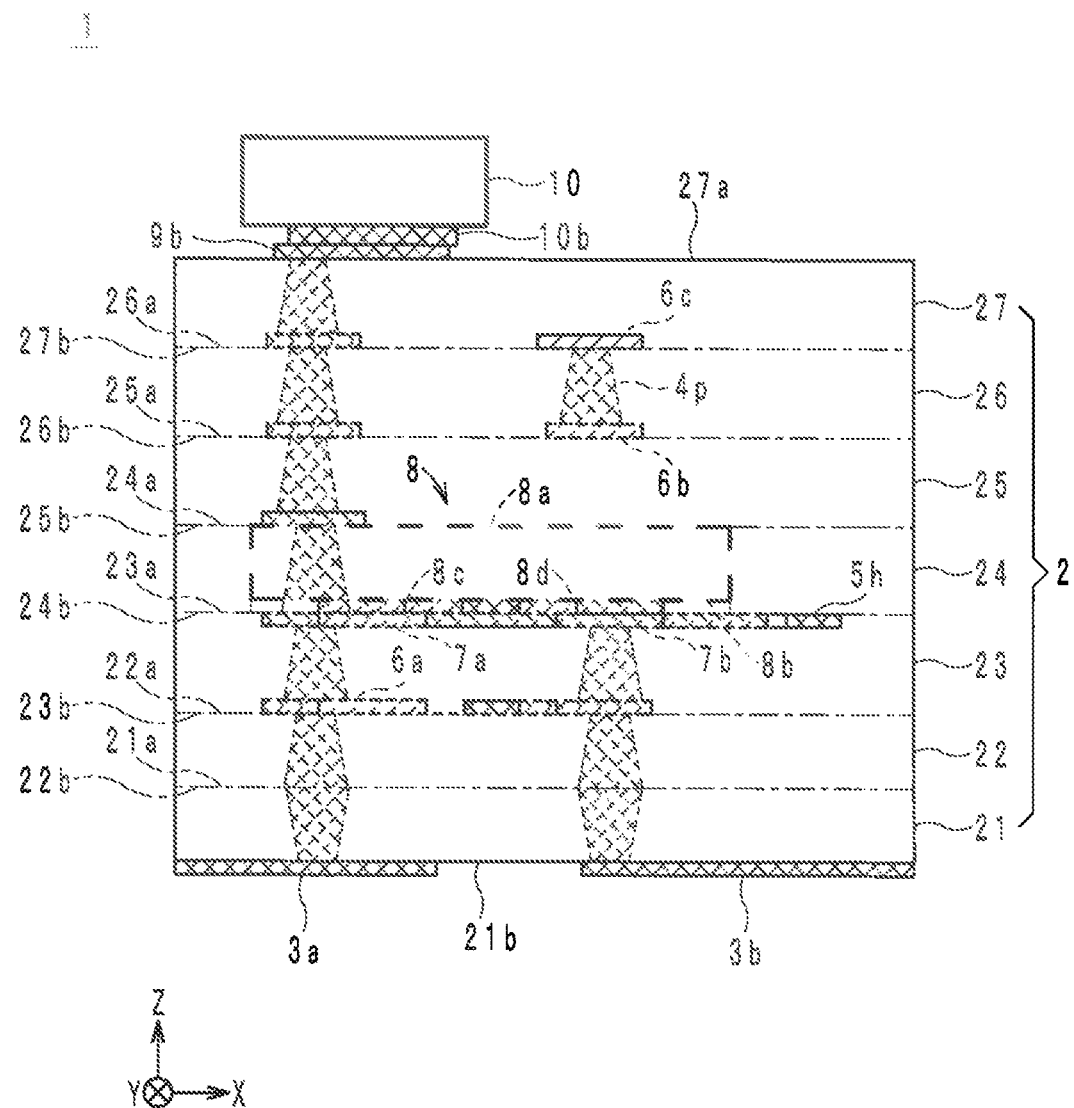
FIG. 1 is a vertical cross-sectional view of a component-embedded substrate according to an embodiment.

Hereinafter, a component-embedded substrate and a manufacturing method thereof according to an embodiment of the present invention are described in detail with reference to the drawings.

Preliminary

As a preliminary, the X-axis, Y-axis, and Z-axis shown in the drawings are described. The X-axis, Y-axis, and Z-axis are perpendicular to one another. The Z-axis, X-axis, and Y-axis respectively represent the layer stacking direction of the resin layers, the left-and-right direction of the resin layers, and the front-and-rear direction of the resin layers. For the sake of convenience, the positive direction sides of the Z-axis, X-axis, and Y-axis are referred to as "upside", "right side", and "depth direction".

Embodiment

Figure 2B:
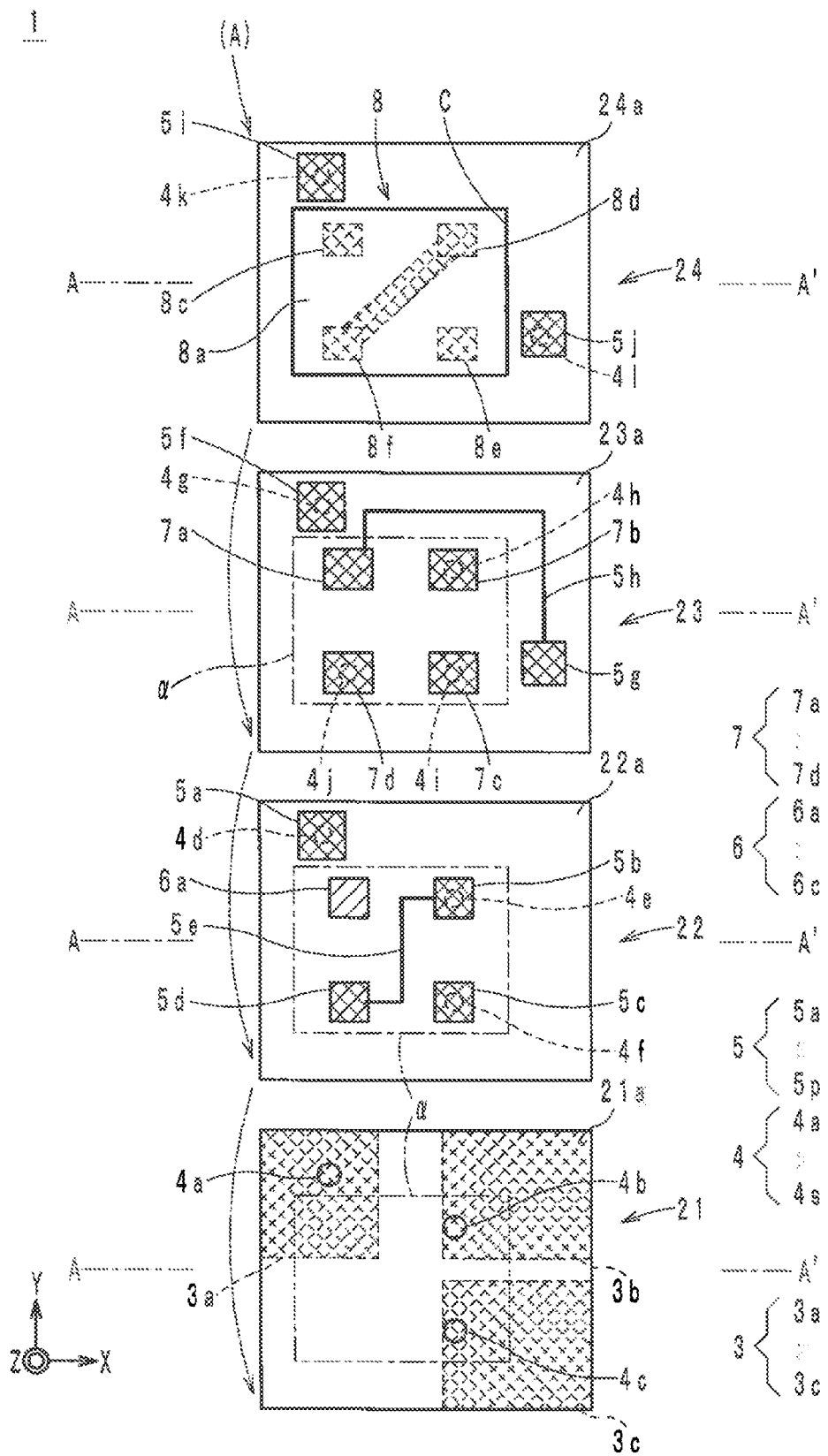
FIG. 2B is a top view of resin layers provided in the lower part of the component-embedded substrate of FIG. 1.

FIG. 1 is a vertical cross-sectional view of a component-embedded substrate of the present embodiment. FIG. 2A and FIG. 2B are top views of resin layers that are constituents of the component-embedded substrate of FIG. 1. Note that FIG. 1 shows a vertical cross-sectional view of the component-embedded substrate taken along plane A-A' that is passing through the centers in the Y-axis direction of the resin layers of FIG. 2 and that is parallel to the ZX plane, which is viewed from the negative direction to the positive direction of the Y-axis. FIG. 1 shows only major portions for the purpose of avoiding complicated illustration. Hereinafter, the component-embedded substrate is described in detail with reference to the drawings.

The component-embedded substrate 1 may include a multilayer body 2, a plurality of external electrodes 3 (three external electrodes 3a to 3c are shown), a plurality of interlayer connectors 4 (nineteen interlayer connectors 4a to 4s are shown), a plurality of wiring conductors 5 (sixteen wiring conductors 5a to 5p are shown), at least one auxiliary member 6 (three auxiliary members 6a to 6c are shown), a plurality of joining conductors 7 (four joining conductors 7a to 7d are shown), at least one component 8 embedded in the multilayer body 2, a plurality of land electrodes 9 (two land electrodes 9a and 9b are shown), and at least one surface mount type electronic component 10.

The multilayer body 2 may be formed by stacking up a plurality of resin layers 21 to 27 (seven resin layers are shown) in the Z-axis direction and bonding the stacked resin layers together. Here, in FIG. 1, the interface of resin layers which are adjacent to each other in the Z-axis direction is imaginarily represented by a chain line. The resin layers 21 to 27 may be made of an electrically insulative flexible material (e.g., thermoplastic resins such as polyimide and liquid crystal polymer). The liquid crystal polymer has excellent high frequency characteristics and low water absorbency and therefore may be particularly preferred as the material of the resin layers 21 to 27. The resin layers 21 to 27 have identical rectangular shapes when viewed in plan from the top. The thickness of each of the resin layers 21 to 27 along the Z-axis direction may range from about 10 to about 100 μm.

The lowermost resin layer 21 may include two principal surfaces (specifically, upper and lower surfaces) $21a$, $21b$ which may be spaced apart and opposite to each other in the Z-axis direction. The principal surface $21b$ may include a plurality of external electrodes 3 which may be used in mounting of the component-embedded substrate 1 to an external circuit element such as another printed wiring board (not shown). These external electrodes 3 may be made of an electrically-conductive material, including but not limited to copper. The thickness of the external electrodes 3 along the Z-axis direction may range from about 5 to about 50 μm.

Examples of the external electrodes 3 shown in FIG. 2B are external electrodes 3a to 3c provided at three corners of the principal surface 21b.

In the resin layer 21, a plurality of interlayer connectors (via conductors) 4 are provided. The interlayer connectors 4 are made of an electrically-conductive material, including but not limited to an alloy of tin and silver. The interlayer connectors 4 of the resin layer 21 are formed at positions immediately above the corresponding external electrodes 3 with the resin layer 21 in between the interlayer connectors 4 and the external electrodes 3 so as to penetrate through the resin layer 21 in the Z-axis direction. The interlayer connectors 4 of the resin layer 21 shown in FIG. 2B are interlayer connectors 4a to 4c corresponding to the external electrodes 3a to 3c.

In the principal surface 21a of the resin layer 21 of FIG. 2A and FIG. 2B, the outer boundary of the component 8 viewed in plan in the layer stacking direction Z is imaginarily shown by a chain line for convenience of description. In the resin layers 22, 23, 25, and 26, the outer boundary is also shown by a chain line. Hereinafter, the outer boundary of the component 8 shown in the resin layers 21 to 23, 25, and 26 is designated by reference mark "a".

The resin layer 22 has two principal surfaces 22a, 22b as does the resin layer 21. The resin layer 22 may be placed on the resin layer 21 such that the principal surface 22b directly contacts the principal surface 21a. A plurality of wiring conductors 5 are provided on the principal surface 22a. These wiring conductors 5 are made of an electrically-conductive material, including but not limited to copper, as are the external electrodes 3. The thickness of the wiring conductors 5 may range from about 5 to about 50 μm.

The wiring conductors 5 of the resin layer 22 shown in FIG. 2B may include wiring conductors 5a to 5e. The wiring conductor 5a may be provided outside the outer boundary α and overlie the interlayer connector 4d. The wiring conductors 5b to 5d may be provided at generally the same positions as terminal electrodes 8d to 8f of the component 8 (described later) when viewed in plan in the layer stacking direction Z. The wiring conductors 5b and 5c may be arranged so as to overlie the interlayer connectors 4e and 4f, respectively. The wiring conductor 5e may be electrically coupled with the wiring conductors 5b, 5d.

On the principal surface 22a, an auxiliary member 6a may be further provided as the first example of the auxiliary members 6 as shown in FIG. 2B. The auxiliary member 6a may be provided at generally the same position as a terminal electrode 8c of the component 8 (described later) when viewed in plan in the layer stacking direction Z. The auxiliary members 6 may be preferably made of the same material as the wiring conductors 5 and other elements from the viewpoint of, for example, the manufacturing cost of the component-embedded substrate 1. In this case, the thickness of the auxiliary members 6 may range from about 5 to about 50 μm as is that of the wiring conductors 5. Note that the other details including the material of the auxiliary members 6, etc., will be described later.

In the resin layer 22, a plurality of interlayer connectors 4 may also be provided. The interlayer connectors 4 of the resin layer 22 may be formed at positions immediately below the corresponding wiring conductors 5 with the resin layer 22 in between the interlayer connectors 4 and the wiring conductors 5 so as to penetrate through the resin layer 22 in the Z-axis direction. The interlayer connectors 4 of the resin layer 22 shown in FIG. 2B may include interlayer connectors 4d to 4f, with the coordinates of each interlayer connectors 4d to 4f corresponding to the wiring conductors 5a to 5c, respectively. For example, the interlayer connector 4d may electrically couple the wiring conductor 5a and the interlayer connector 4a. In another example, the interlayer connector 4e may electrically couple the wiring conductor 5b with the interlayer connector 4b. In yet another example, the interlayer connector 4f may electrically couple the wiring conductor 5c with the interlayer connector 4c.

The resin layer 23 has principal surfaces 23a, 23b which may be spaced apart and opposite to each other in the layer stacking direction Z. The resin layer 23 may be placed on the resin layer 22. On the principal surface 23a, wiring conductors 5f to 5h may be provided as examples of the plurality of wiring conductors 5 as shown in FIG. 2B. The wiring conductors 5f, 5g may be provided outside the outer boundary α. The wiring conductor 5f may overlie the interlayer connector 4g and may be provided at the far left corner of the principal surface 23a. The wiring conductor 5g may be provided at the near right corner of the principal surface 23a. Large part of the wiring conductor 5h may be provided outside the outer boundary α and electrically couple the wiring conductor 5g with a joining conductor 7a (described later).

A plurality of joining conductors 7 may be provided on the principal surface 23a. The joining conductors 7 may be made of the same material as the wiring conductors 5 and other elements and may have a thickness ranging between about 5 and 50 μm. The joining conductors 7 may be joined to the terminal electrodes of the component 8. The plurality of joining conductors 7 shown in FIG. 2B may be joining conductors 7a to 7d. The joining conductors 7a to 7d may be provided at generally the same positions as the terminal electrodes 8c to 8f (described later) when viewed in plan in the layer stacking direction Z. The joining conductors 7b to 7d may be arranged so as to overlie the interlayer connectors 4h to 4j.

As clearly seen from the foregoing, the interlayer connectors 4g to 4j may be provided in the resin layer 23. The interlayer connector 4g may electrically couple the wiring conductors 5f, 5a. The interlayer connector 4h may electrically couple the joining conductor 7b with the wiring conductor 5b. The interlayer connector 4i may electrically couple the joining conductor 7c with the wiring conductor 5c. The interlayer connector 4j may electrically couple the joining conductor 7d with the wiring conductor 5d.

The resin layer 24 has principal surfaces 24a, 24b which may be spaced apart and opposite to each other in the layer stacking direction Z. The resin layer 24 may be placed on the resin layer 23. At the center of the resin layer 24, there is a through hole penetrating through the resin layer 24 in the layer stacking direction Z. This through hole may include a cavity C configured for embedding the component 8 in the cavity C of the multilayer body 2. The through hole may include an opening which is slightly larger than the outer boundary of the component 8 when viewed in plan in the layer stacking direction Z. The through hole may penetrate through the resin layer 24 in the layer stacking direction Z.

Now, the component 8 is described. The component 8 may include, typically, an active component, a passive component, or a MEMS (MicroElectroMechanical Systems) component. This component 8 may include two principal surfaces (upper surface, lower surface) 8a, 8b. The principal surfaces 8a, 8b may be spaced apart and opposite to each other in the layer stacking direction Z and have a rectangular shape when viewed in plan in the layer stacking direction Z while other shapes are also possible. On at least one of these principal surfaces 8a, 8b, a plurality of terminal electrodes may be provided in a matrix arrangement. As an example, in the present embodiment, four terminal electrodes 8c to 8f may be provided at respective corners of the principal surface 8b. The terminal electrode 8c may be a signal input terminal. The terminal electrode 8e may be a signal output terminal. The terminal electrodes 8d, 8f may be ground terminals.

Wiring conductors 5i, 5j (see FIG. 2B) may be provided on the principal surface 24a of the resin layer 24. The wiring conductors 5i, 5j may be arranged so as to overlie the interlayer connectors 4k, 4l, respectively, and electrically coupled to the wiring conductors 5f, 5g via the interlayer connectors 4k, 4l.

The resin layer 25 may include principal surfaces 25a, 25b which may be spaced apart and opposite to each other in the layer stacking direction Z. The resin layer 25 may be placed on the resin layer 24. On the principal surface 25a, wiring conductors 5k to 5n may be provided as the wiring conductors 5. The wiring conductors 5k, 5l may be provided outside the outer boundary α and electrically coupled to the wiring conductors 5i, 5j via the interlayer connectors 4m, 4n. The wiring conductor 5m may be provided within the outer boundary α, more specifically at the near left, lower corner of the outer boundary α. The wiring conductor 5n may be, for example, a coil in a meander shape. The wiring conductor 5n may be provided between the wiring conductors 5l, 5m.

On the principal surface 25a, an auxiliary member 6b may be provided as the second example of the auxiliary members 6 as shown in FIG. 2A. The auxiliary member 6b may be provided within the outer boundary α, at the far right corner of the outer boundary α.

The resin layer 26 may include principal surfaces 26a, 26b which may be spaced apart and opposite to each other in the layer stacking direction. The resin layer 26 may be placed on the resin layer 25. On the principal surface 26a, wiring conductors 5o, 5p may be provided as the wiring conductors 5. The wiring conductor 5o may be provided outside the outer boundary α, at the far left, upper corner of the principal surface 26a. The wiring conductor 5o may be coupled to the wiring conductor 5k via the interlayer connector 4o. The wiring conductor 5p may be provided within the outer boundary α, at the near left, lower corner of the outer boundary α. The wiring conductor 5p may be electrically coupled to the wiring conductor 5m via the interlayer connector 4q.

On the principal surface 26a, an auxiliary member 6c may be provided as the third example of the auxiliary members 6. The auxiliary member 6c may be parallel to the Y-axis and has a belt-like shape, extending from the near lower, right corner to the far upper, right corner within the outer boundary α. Here, the auxiliary member 6c may be electrically coupled to the auxiliary member 6b via the interlayer connector 4p.

The resin layer 27 may be the uppermost layer of the multilayer body 2 and may be placed on the resin layer 26. The resin layer 27 may include principal surfaces 27a, 27b which may be spaced apart and opposite to each other in the layer stacking direction Z. On the principal surface 27a, land electrodes 9a, 9b may be provided as shown in FIG. 2A. The land electrodes 9a, 9b may be electrically coupled to the wiring conductors 5o, 5p via the interlayer connectors 4r, 4s. Onto these land electrodes 9a, 9b, a surface mount type electronic component 10 may be mounted via external electrodes 10a, 10b provided at the lower surface of the electronic component 10 and solder or the like.

With the above configuration, an electronic circuit with the external electrodes 3 serving as input/output terminals may be formed in the component-embedded substrate 1. This electronic circuit may include the interlayer connectors 4 (nineteen interlayer connectors 4a to 4s are shown), the wiring conductors 5 (sixteen wiring conductors 5a to 5p are shown), the joining conductors 7 (four joining conductors 7a to 7d are shown), the component 8, the land electrodes 9 (two land electrodes 9a and 9b are shown), and the electronic component 10, exclusive of the auxiliary members 6 (three auxiliary members 6a to 6c are shown).

(Manufacturing Method of Component-Embedded Substrate)

Next, a manufacturing method of the above-described component-embedded substrate 1 is described in detail with reference to the drawings. In the following section, a manufacturing process of a single component-embedded substrate 1 is described, although in actuality large-surface resin sheets are stacked up and cut, whereby a large quantity of component-embedded substrates 1 are simultaneously manufactured.

Figure 3A:
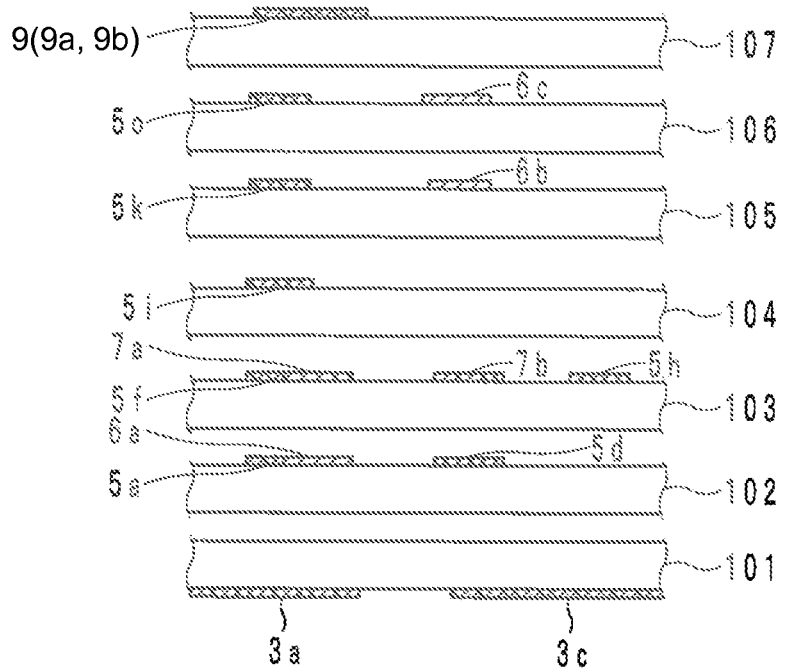
FIG. 3A is a schematic diagram illustrating the first process in a manufacturing method of the component-embedded substrate of FIG. 1.

First, a required number of large-surface resin sheets are prepared, one of the surfaces of which may be generally entirely covered with a copper foil. These large-surface resin sheets may constitute any of the resin layers 21 to 27 after completion of manufacture of the component-embedded substrate 1. Therefore, resin sheets 101 to 107 corresponding to the resin layers 21 to 27 may be prepared as shown in FIG. 3A. The resin sheets 101 to 107 may be preferably made of a liquid crystal polymer as previously described. Note that the surface of the copper foil may be preferably plated with zinc or the like so as to be flat for anticorrosion purposes.

Then, a plurality of external electrodes 3 may be formed by photolithography on one surface of the resin sheet 101 (i.e., a surface of the resin sheet 101 which is to become the principal surface 21b after completion of manufacture) as shown in FIG. 3A. More specifically, firstly, a resist which has the same shape as the external electrodes 3 may be printed on the copper foil of the resin sheet 101. Thereafter, etching may be performed on the copper foil, whereby exposed part of the copper foil which is not covered with the resist may be removed. Thereafter, the resist may be removed. As a result, the external electrodes 3 may be formed.

By a photolithography process which is basically the same as that described above, the wiring conductors 5 and the auxiliary members 6 may be formed on one surface of the resin sheet 102 (i.e., a surface of the resin sheet 102 which is to become the principal surface 22a after completion of manufacture) as shown in FIG. 3A. Likewise, required ones of the wiring conductors 5, the auxiliary members 6, the joining conductors 7, and the land electrodes 9 may be formed on one surface of each of the resin sheets 103 to 107 (i.e., surfaces of the resin sheets 103 to 107 which are to become the principal surfaces 23a to 27a after completion of manufacture).

Figure 3B:
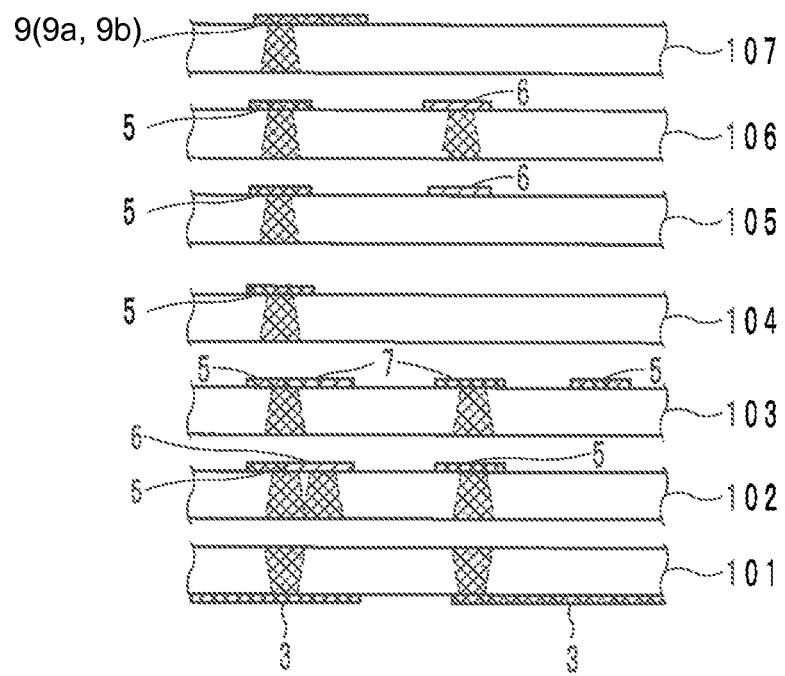
FIG. 3B is a schematic diagram illustrating a process following the first process of FIG. 3A.

Then, as shown in FIG. 3B, portions of the resin sheet 101 at which the interlayer connectors 4 (FIGS. 2A-2B) are to be formed may be irradiated with a laser beam supplied through a surface which may be not covered with the copper foil. As a result, via holes may be formed. Thereafter, an electrically-conductive paste which is to become the interlayer connectors 4 after completion of manufacture may be supplied into the via holes. Likewise, via holes may also be formed in the resin sheets 102 to 107, and an electrically-conductive paste may be supplied into the via holes.

Figure 3C:
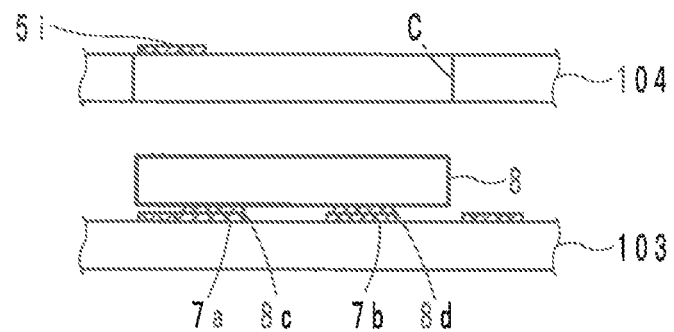
FIG. 3C is a schematic diagram illustrating a process following the process of FIG. 3B.

Then, as shown in FIG. 3C, the terminal electrodes 8c to 8d of the component 8 may be positioned on the joining conductors 7a to 7b of the resin sheet 103. Further, the resin sheet 104 may be stamped out at a predetermined position using a die, whereby a through hole for the cavity C may be formed.

Figure 3D:
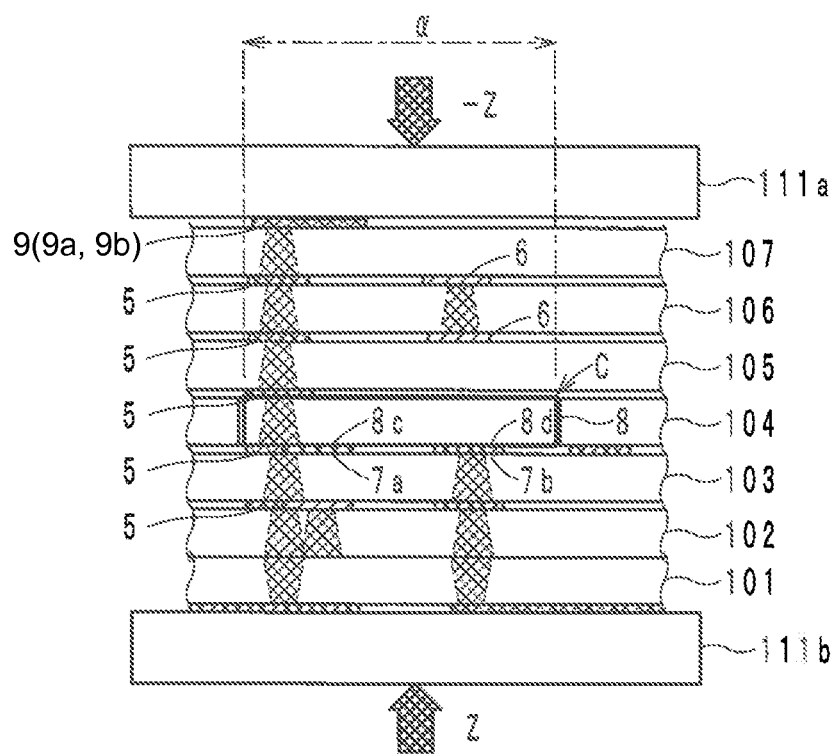
FIG. 3D is a schematic diagram illustrating a process following the process of FIG. 3C.

Then, the resin sheets 101 to 107 may be stacked up in this order from the bottom to the top as shown in FIG. 3D. In stacking of the sheets, a surface of the resin sheet 101 which has the external electrodes 3 may be oriented downward, while in the other resin sheets 102 to 107, surfaces which have the wiring conductors 5, the auxiliary members 6, the joining conductors 7, and the land electrodes 9 may be oriented upward.

Thereafter, heat and pressure may be applied to the stacked resin sheets 101 to 107 by heat press plates 111a, 111b, from both the top and the bottom of the stacked resin sheets, along the layer stacking direction Z. By this heating and compression process, the resin sheets 101 to 107 may be softened and bonded together into a single structure, and the electrically-conductive paste in the via holes may be solidified. As a result, interlayer connectors 4 (FIGS. 2A-2B) are formed. Lastly, the electronic component 10 may be mounted onto the land electrodes 9a, 9b, and then, the resin sheets 101 to 107 in the form of a single structure may be cut into pieces of a predetermined size. As a result, manufacture of the component-embedded substrate 1 is completed.

(Configuration and Functions/Effects of Auxiliary Members)

Figure 4:
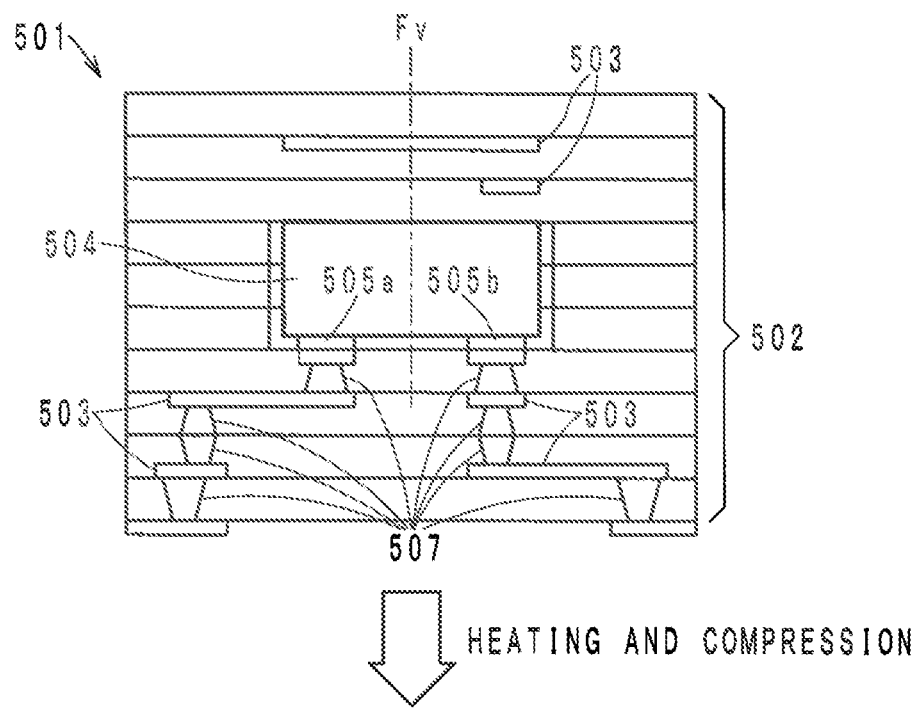
FIG. 4 is a schematic diagram illustrating details of technical problems in a conventional component-embedded substrate.
Figure 4:
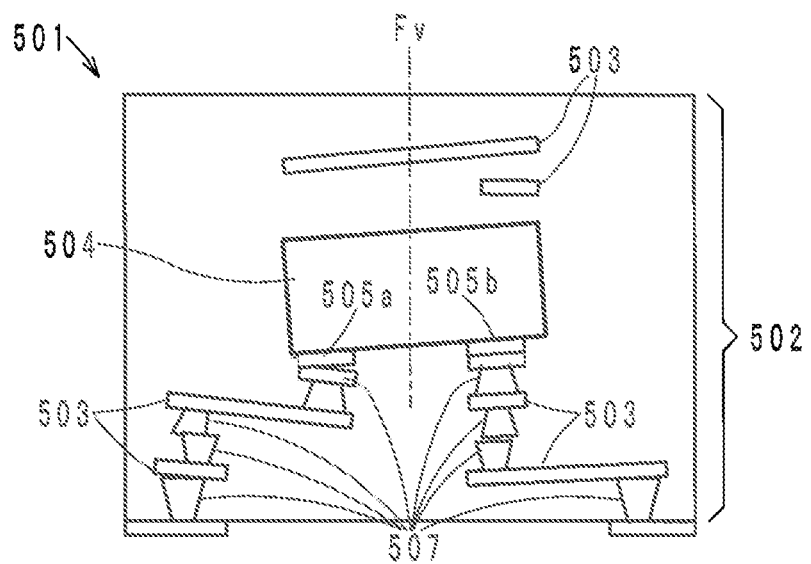

The component-embedded substrate 1 of the present embodiment is a solution to the technical problems such as tilting of an embedded electronic component to one side relative to the layer stacking direction Z and occurrence of bonding failure. These technical problems may be described in more detail with reference to FIG. 4. FIG. 4 is a vertical cross-sectional view of a conventional component-embedded substrate 501. As shown in FIG. 4, in some cases, a plurality of wiring conductors 503 may be provided inside a multilayer body 502 of the component-embedded substrate 501 in an asymmetrical arrangement with respect to the vertical center plane Fv of an embedded component 504.

In the case of the component-embedded substrate 501 that has the above-described wiring conductors 503, such problems are likely to occur during the heating and compression in the manufacture process that the embedded component 504 tilts to one side relative to the layer stacking direction, and bonding failure may occur between the wiring conductors 503 that are internal wirings and the interlayer connectors 507. More specifically, during the heating and compression, substantially uniform pressure may be applied across the upper and lower surfaces of the multilayer body 502. However, due to the wiring conductors 503 in the asymmetrical arrangement, the pressure may not be uniformly applied to the embedded component 504, i.e., nonuniform pressure may be applied to the embedded component 504. For example, the wiring conductors 503 and the interlayer connectors 507 interposed between the terminal electrode 505a and the upper and lower surfaces of the multilayer body 502 may be relatively small in number. Therefore, relatively large pressure P1 may act on the terminal electrode 505a. On the other hand, as for the terminal electrode 505b, there are a large number of interposed wiring conductors 503 and interlayer connectors 507, and therefore, relatively small pressure P2 may act on the terminal electrode 505b. Such nonuniform pressure application may lead to tilting of the embedded component 504 relative to the layer stacking direction Z and readily causes disconnection of the wiring conductors 503 and the interlayer connectors 507 and mutual disconnection of the interlayer connectors 507. That is, problems such as bonding failure are likely to occur inside the component-embedded substrate 501.

To solve the above-described technical problems, the component-embedded substrate 1 of the present embodiment includes the auxiliary members 6 as shown in FIG. 1, FIG. 2A and FIG. 2B. The auxiliary members 6 are, firstly, provided at positions enclosed within the outer boundary α of the component 8 when viewed in plan in the layer stacking direction Z of the component-embedded substrate 1. More specifically, the auxiliary members 6 may be provided at such positions that the auxiliary members 6 at least partially overlap the terminal electrode 8c when viewed in plan in the layer stacking direction Z. Also, as for the terminal electrodes 8d to 8f, the auxiliary members 6 may be provided so as to at least partially overlap the terminal electrodes 8d to 8f, respectively. By providing the auxiliary members 6 at such positions that the auxiliary members 6 at least partially overlap the terminal electrodes 8c to 8f when viewed in plan in the layer stacking direction Z, the pressures on the terminal electrodes 8c to 8f of the component 8 can be readily balanced. That is, in compressing the component 8 that has relatively high stiffness and the multilayer body 2 whose stiffness decreases in the heating and compression process, the auxiliary members 6 may be used to adjust the structural balance inside the multilayer body 2, the structural balance being considered relative to the terminal electrodes 8c to 8f, so that the pressures on the terminal electrodes 8c to 8f can be readily balanced. Here, particularly, from the viewpoint of optimizing the pressure balance, it is most preferred to provide the auxiliary members 6 so as to overlap both the terminal electrodes 8c to 8f and the joining conductors 7a to 7d, which are in contact with the terminal electrodes 8c to 8f, when viewed in plan in the layer stacking direction Z.

The auxiliary members 6 may reduce the difference between pressures on a plurality of terminal electrodes, which would be caused in the heating and compression process of a component-embedded substrate that does not include the auxiliary members 6. Accordingly, the pressures on the respective terminal electrodes are mutually balanced in the heating and compression process. Note that the verb "balance" used in the present embodiment includes not only offsetting the difference between the pressures on the respective terminal electrodes to zero and causing that difference to approximate zero, but also reducing that difference in pressures on the respective terminal electrodes.

In the present embodiment three auxiliary members 6a to 6c are exemplarily shown. First, the auxiliary member 6a may be formed on the principal surface 22a as shown in FIG. 2B. The wiring conductors 5 are provided at three corners of the outer boundary α on the principal surface 22a while no wiring conductor 5 is provided at the remaining one corner. If the heating and the compression are performed in the absence of the auxiliary member 6a, the pressure on the junction of the terminal electrode 8c and the joining conductor 7a may be significantly uneven as compared with those on the other junctions, and as a result, there is a probability that bonding failure may occur. To remove this unevenness, the auxiliary member 6a may be provided on the principal surface 22a, at a position generally immediately below the terminal electrode 8a.

The auxiliary members 6b, 6c may be provided on the principal surfaces 25a, 26a. As seen from FIG. 1 and FIG. 2A, the wiring conductors 5 may be densely provided above the terminal electrode 8f, and these elements may be connected by the interlayer connectors 4. On the other hand, no wiring conductor 5 may be provided above the terminal electrode 8*d* that is diagonally opposite to the terminal electrode 8*f*, so that they are sparse. To prevent bonding failure attributable to this arrangement, the auxiliary members 6*b*, 6*c* may be provided on a plurality of resin layers 25, 26, at positions above the terminal electrode 8*d*. The auxiliary members 6*b*, 6*c* may be connected by the interlayer connector 4*p*. As described herein, to balance the pressures on the respective junctions, not only the auxiliary members 6*b*, 6*c* but also the interlayer connector 4*p* can be used as an auxiliary member.

As described in the foregoing, according to the present embodiment, the auxiliary members 6 may be provided in portions of the multilayer body 2 in which the wiring conductors 5 are sparse, within the outer boundary of the component 8 when viewed in plan in the layer stacking direction Z. Due to these auxiliary members 6, the difference between the pressures on a plurality of junctions in the heating and compression process is reduced, and occurrence of bonding failure in the heating and compression process can be prevented.

Next, the material of the auxiliary members 6 is described. The auxiliary members 6 are not limited to the electrically-conductive material but may be made of an insulative material as will be described later. Note that, however, the material of the auxiliary members 6 may be required to have a melting point higher than the melting point of the material of the resin layers 21 to 27 and also higher than the temperature applied in the heating and compression process.

Figure 5:
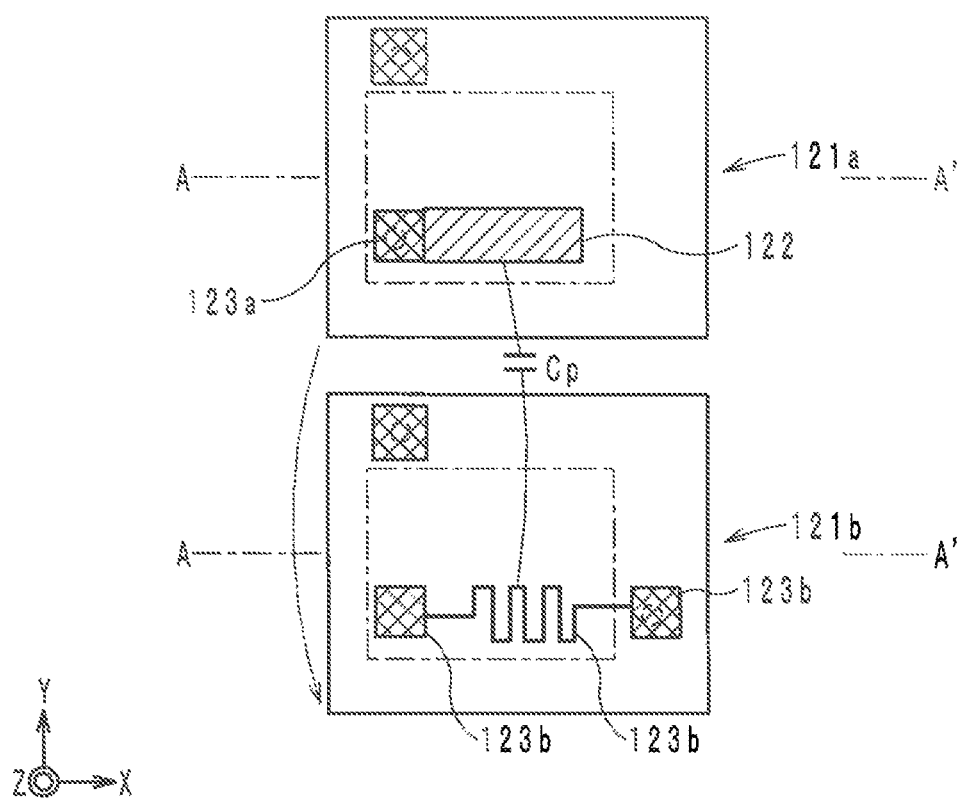
FIG. 5 is a schematic diagram illustrating problems in the case where an auxiliary member is electrically coupled to wiring conductors.

The auxiliary members 6 may be electrically insulated from all of the wiring conductors 5 as previously described. In the present embodiment, the auxiliary members 6 may be made of the same material as the wiring conductors 5. As such, the resin layers 21 to 27 may be made of an insulative material, and the auxiliary members 6 may physically be separated from the wiring conductors 5. Further, the auxiliary members 6 may not be connected to the wiring conductors 5 by a conductor. As a result, the auxiliary members 6 may be insulated from all of the wiring conductors 5. The reason for this insulation is that if any auxiliary member 122 formed in a resin layer 121*a* is electrically coupled to a wiring conductor 123*a* as shown in FIG. 5, there may be a probability that unwanted capacitance Cp or short circuit occurs between the auxiliary member 122 and a wiring conductor 123*b* provided in a different resin layer.

In the present embodiment, from the viewpoint of the manufacturing cost, the auxiliary members 6 may be made of the same material as the wiring conductors 5. However, the present invention is not limited to this example. The auxiliary members 6 may be made of a different material. If the auxiliary members 6 are made of an insulative material, it is not necessary to consider occurrence of unwanted capacitance. Therefore, the positioning flexibility of the auxiliary members 6 improves.

The auxiliary members 6 may not need to correspond to all of the terminal electrodes 8*c* to 8*f* of the component 8.

From the viewpoint of easy insertion of the component 8, the through hole formed in the resin layer 24 may be slightly larger than the principal surface 8*a* of the component 8. Therefore, before the heating and compression process, there may be a small gap between the component 8 and the resin layer 24. This gap may be filled with the flowing resin in the heating and compression process, so that the component 8 may be in close contact with the multilayer body 2 and encapsulated in the multilayer body 2. From this viewpoint, it is preferred that the auxiliary members 6 do not extend across the outer boundary α of the component 8 when viewed in plan in the layer stacking direction Z, i.e., the auxiliary members 6 are provided at positions enclosed within the outer boundary α (e.g., see FIG. 3D). The reason for that is that if the auxiliary members 6 extend across the outer boundary α, there may be a probability that the auxiliary members 6 prevent the flowing resin from flowing into the gap.

(Variations)

Figure 6B:
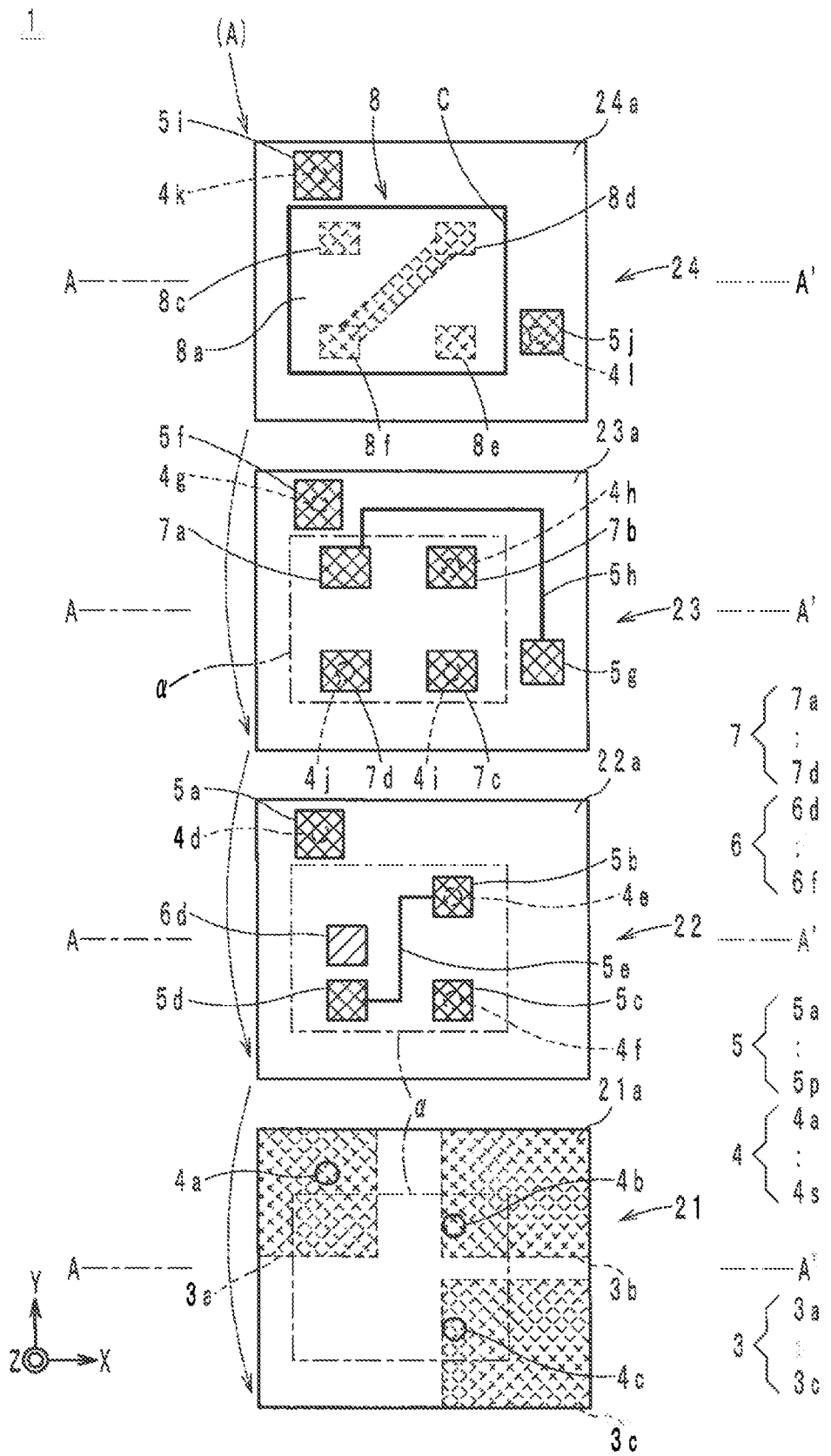
FIG. 6B is a top view of resin layers provided in the lower part of the component-embedded substrate according to the variation.
Figure 7:
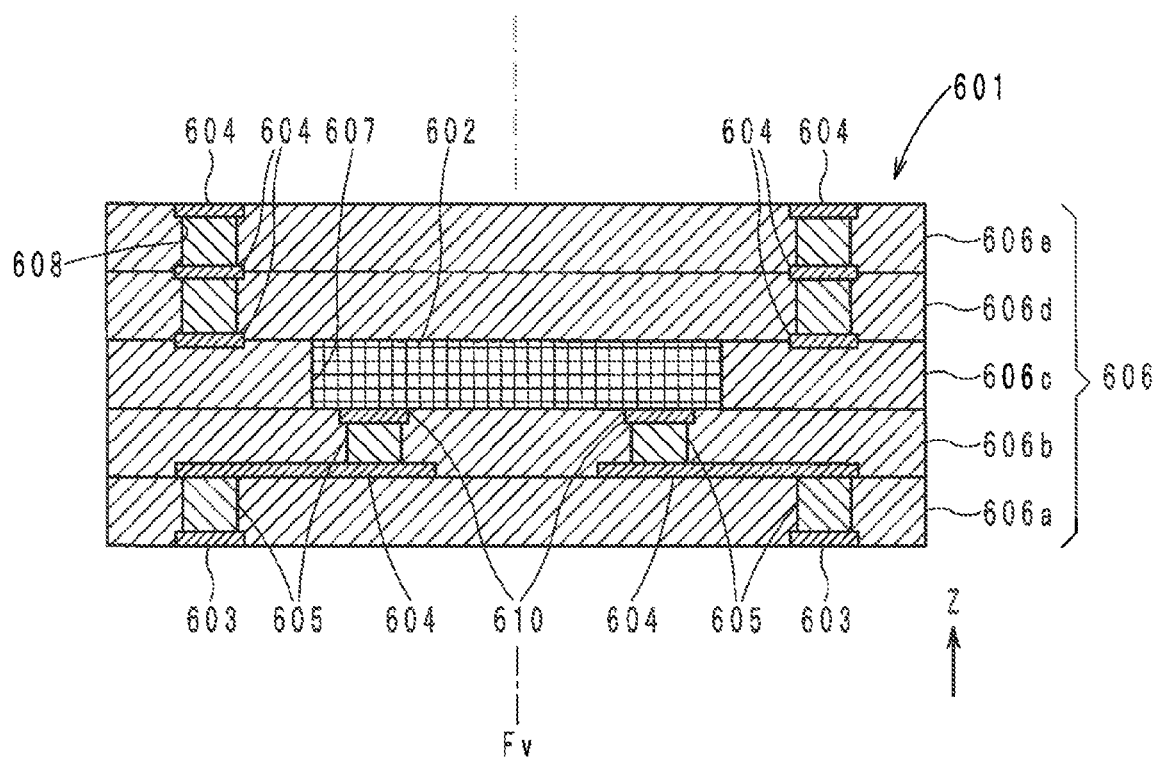
FIG. 7 is a schematic diagram showing a vertical cross-sectional view of a conventional component-embedded substrate.
Figure 8A:
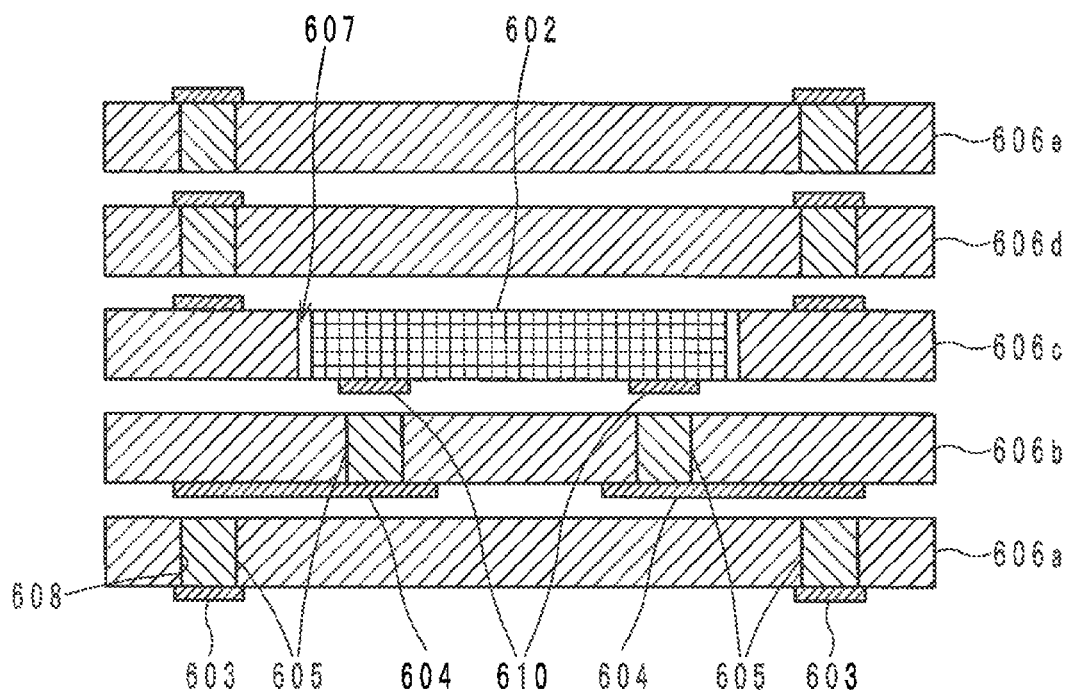
FIG. 8A is a schematic diagram showing a layer stacking process in manufacture of the conventional component-embedded substrate.

In the above-described embodiment, preferred positions of the auxiliary members 6 may be determined such that the auxiliary members 6 overlap the junctions of the terminal electrodes 8*c* to 8*f* and the joining conductors 7 when viewed in plan in the layer stacking direction Z. However, the present invention is not limited to this example. The auxiliary members 6 may be provided at such positions that the auxiliary members 6 are within the outer boundary α but do not overlap the junctions of the terminal electrodes 8*c* to 8*f* and the joining conductors 7 when viewed in plan in the layer stacking direction Z, such as the auxiliary members 6*d* to 6*f* shown in FIG. 6A and FIG. 6B. In this arrangement also, the auxiliary members 6 contribute to reducing the difference between the pressures which act on a plurality of junctions in the heating and compression process in manufacture of a component-embedded substrate. Note that, however, to make the pressure difference as small as possible, the auxiliary members 6*d* to 6*f* are preferably provided at such positions that the auxiliary members 6*d* to 6*f* at least partially overlap the terminal electrodes 8*c* to 8*f* when viewed in plan in the layer stacking direction Z.

When the terminal electrodes 8*c* to 8*f* and the joining conductors 7*a* to 7*d* are joined via solder layers or bumps, the pressure concentrates on each solder layer or each bump, so that the pressure difference may be significantly large in the case of no auxiliary members 6. As a result, the component 8 can more readily tilt to one side relative to the layer stacking direction Z, or bonding failure can more readily occur between the wiring conductors 5 that are internal wirings and the interlayer connectors 4 or between the interlayer connectors 4. That is, problems are more likely to occur inside the component-embedded substrate 1. Thus, the present embodiment provides still greater effects when the terminal electrodes 8*c* to 8*f* and the joining conductors 7*a* to 7*d* are joined via bumps or the like.

Any of the plurality of wiring conductors 5 of the present embodiment may be configured as a wiring conductor which functions not only as a coil conductor but also as a capacitor conductor, a ground conductor, or the like.

The plurality of joining conductors 7 of the present embodiment may not necessarily be planar conductors. That is, the interlayer connectors 4 (via conductors) may be used as joining conductors. In this case, the interlayer connectors 4 and the terminal electrodes 8*c* to 8*f* may be directly joined together.

In the present embodiment, the component 8 exemplarily shown above has the terminal electrodes 8*c* to 8*f* on the lower surface. However, the present invention may not be limited to this example. The component 8 may have the terminal electrodes 8*c* to 8*f* on the upper surface. Alternatively, the component 8 may have terminal electrodes at both ends. In this case, large parts of the terminal electrodes of the component 8 cover two side surfaces and, however, the remaining parts of the terminal electrodes are provided at both ends of the upper and lower surfaces of the component 8.

What is claimed is:

1. A component-embedded substrate comprising:
a multilayer body formed by stacking up a plurality of resin layers in a predetermined direction, the plurality of resin layers being made of a thermoplastic material;
a component embedded in the multilayer body, the component having a plurality of terminal electrodes, at least part of the terminal electrodes being provided on an opposite surface with respect to the predetermined direction;
a plurality of joining conductors provided in the multilayer body and joined to the plurality of terminal electrodes;
a plurality of wiring conductors provided in the multilayer body and electrically coupled to the plurality of joining conductors; and
at least one auxiliary member enclosed within an outer boundary of the component when viewed in plan in the predetermined direction and provided in the multilayer body, the auxiliary member being electrically insulated from each of the plurality of wiring conductors and being arranged to balance pressures acting on the plurality of terminal electrodes when pressure is applied on the multilayer body in a manufacture process.

2. The component-embedded substrate according to claim 1, wherein the auxiliary member is provided so as to at least partially overlap at least one of the plurality of terminal electrodes when viewed in plan in the predetermined direction.

3. The component-embedded substrate according to claim 2, wherein the auxiliary member overlaps at least one of the joining conductors.

4. The component-embedded substrate according to claim 1, wherein
any of the plurality of wiring conductors is provided within the outer boundary of the component when viewed in plan in the predetermined direction and provided in any of the plurality of resin layers, and
the auxiliary member is provided in the same resin layer as the wiring conductor provided within the outer boundary of the component when viewed in plan in the predetermined direction.

5. The component-embedded substrate according to claim 1, wherein the auxiliary member comprises the same material as the plurality of wiring conductors.

6. The component-embedded substrate according to claim 1, wherein
the auxiliary member includes a plurality of auxiliary members, and
the plurality of auxiliary members are provided at different positions in the multilayer body.

7. The component-embedded substrate according to claim 1, wherein
the auxiliary member includes a plurality of auxiliary members, and
the plurality of auxiliary members are provided in different resin layers and connected together by an interlayer connector.

8. The component-embedded substrate according to claim 1, wherein each of the plurality of resin layers comprises a liquid crystal polymer.

9. The component-embedded substrate according to claim 1, wherein the auxiliary member comprises an insulative material.

10. The component-embedded substrate according to claim 1, wherein a melting point of the auxiliary member is higher than the melting point of the resin layers and temperature in a heating and compression process.

11. The component-embedded substrate according to claim 1, wherein the auxiliary member is provided so as not to overlap at least one of the plurality of terminal electrodes when viewed in plan in the predetermined direction.

12. The component-embedded substrate according to claim 1, wherein the auxiliary member comprises an interlayer connector.

13. The component-embedded substrate according to claim 1, wherein first parts of the terminal electrodes are provided on two side surfaces of the component and second parts of the terminal electrodes are provided at both ends of the upper and lower surface of the component.

14. A method for manufacturing a component-embedded substrate in which a component is embedded, the component having a plurality of terminal electrodes, at least part of the terminal electrodes being provided on an opposite surface with respect to a predetermined direction, the method comprising:
forming, in a plurality of resin layers which are made of a thermoplastic material, a plurality of joining conductors which are to be joined to the plurality of terminal electrodes, a plurality of wiring conductors which are to be electrically coupled to the plurality of joining conductors, and at least one auxiliary member within a region where the component is to be placed when viewed in plan in the predetermined direction;
forming a multilayer body by stacking up the plurality of resin layers in the predetermined direction while embedding the component during the stacking of the layers; and
heating and compressing the multilayer body,
wherein the auxiliary member is electrically insulated from each of the plurality of wiring conductors and arranged to balance pressures acting on the plurality of terminal electrodes during the heating and compression of the multilayer body.

15. The method of claim 14, wherein forming at least one auxiliary member comprises providing the auxiliary member so as to overlap at least one of the terminal electrodes when viewed in plan in the predetermined direction.

16. The method of claim 15, wherein forming at least one auxiliary member comprises providing the auxiliary member overlapping at least one of the joining conductors.

17. The method of claim 14, wherein forming at least one auxiliary member comprises providing the auxiliary member so as not to overlap at least one of the plurality of terminal electrodes when viewed in plan in the predetermined direction.

18. The method of claim 14, wherein the auxiliary member comprises the same material as the plurality of wiring conductors.

19. The method of claim 14, wherein the auxiliary member comprises an insulative material.

20. The method of claim 14, wherein a melting point of the auxiliary member is higher than the melting point of the resin layers and a temperature in a heating and compression process.

* * * * *